United States Patent [19]

Suzuki et al.

[11] Patent Number: 4,621,260

[45] Date of Patent: Nov. 4, 1986

[54] THIN-FILM TRANSISTOR CIRCUIT

[75] Inventors: Kouji Suzuki, Urbana, Ill.; Mitsushi Ikeda, Yokohama; Toshio Aoki, Hiratsuka, both of Japan

[73] Assignee: Tokyo Shibaura Denki Kabushiki Kaisha, Kawasaki, Japan

[21] Appl. No.: 563,754

[22] Filed: Dec. 21, 1983

[30] Foreign Application Priority Data

Dec. 25, 1982 [JP] Japan ............................ 57-232815

[51] Int. Cl.⁴ .......................................... G09G 3/02
[52] U.S. Cl. ................................. 340/719; 340/805
[58] Field of Search ............. 340/718, 719, 784, 805

[56] References Cited

U.S. PATENT DOCUMENTS

| | | | |
|---|---|---|---|
| 4,140,945 | 2/1979 | Trogdon | 340/805 X |
| 4,413,256 | 11/1983 | Yasuda et al. | 340/805 X |
| 4,471,347 | 9/1984 | Nakazawa et al. | 340/719 |
| 4,532,506 | 7/1985 | Kitazina et al. | 340/805 X |

FOREIGN PATENT DOCUMENTS 2050668  1/1981  United Kingdom .
2081018  2/1982  United Kingdom .

OTHER PUBLICATIONS

IEEE Conference Record of 1980 Biennial Display Research Conference, 21st-23rd Oct. 1980, Cherry Hill, New York, pp. 111-113 IEEE, New York, US, F. C. Luo et al.: "A Low-Leakage-Current Thin-Film Transistor for Flat-Panel Display, *pp. 111-112*.
Proceedings of the SID, vol. 19, No. 2, Sep. 1978, pp. 63-67; F. C. Luo et al.: "Alphanumeric and Video Performance of a 6"X 6"30 Lines Per Inch Thin Film Transistor-Liquid Crystal Display Panel" *pp. 63-64*.
Computer Design, vol. 12, No. 9, Sep. 1973, pp. 48-50; "Increased Address Rate Achieved in Liquid Crystal Panel Display *Whole Article*.
Electronic Engineering, vol. 54, No. 662, Feb. 1982, pp. 38-53, London, GB; C. M. Boardman, et al.: "Future Flat displays the Liquid Crystal Answer *pp. 48,51*.
1982 SID International Symposium Digest of Technical Papers, vol. 13, p. 186; E. Lueder et al.; May 11, 1982.
1982 SID International Symposium Digest of Technical Papers, vol. 13, p. 34; M. Matsuura et al; May 11, 1982.

*Primary Examiner*—Gerald L. Brigance
*Assistant Examiner*—Vincent P. Kovalick
*Attorney, Agent, or Firm*—Oblon, Fisher, Spivak, McClelland & Maier

[57] ABSTRACT

A thin-film transistor circuit used to drive a liquid crystal display device is disclosed, which circuit includes a plurality of circuit components which are arranged in the form of a matrix as to be connected with data lines for supplying an image signal and with address lines for supplying a gate pulse signal, whereby the circuit components control the picture element display in the unit picture element region of the LCD device. Each circuit component has a capacitor connected to the unit picture element region for temporarily storing the image signal, and a TFT transfer gate having a gate electrode connected to one of the address lines, a source electrode connected to one of the data lines, and a drain electrode connected to the capacitor. The transfer gate performs the switching operation in response to the gate pulse signal, thereby transferring the image signal to the capacitor. A compensating pulse signal which is synchronized with the gate pulse signal and has a polarity opposite to that of the gate pulse signal is applied to the capacitor, thereby preventing a decrease in the image signal voltage across this capacitor due to the parasitic capacitance component existing in the thin-film transistor.

10 Claims, 21 Drawing Figures

THIN-FILM TRANSISTOR CIRCUIT

BACKGROUND OF THE INVENTION

The present invention relates in general to thin-film transistor circuits and, in more particular, to a thin film transistor circuit which is utilized as the transistor matrix array of a thin display device, such as a liquid crystal display device.

A thin display device which includes a drive circuit comprised of a transistor matrix array has recently been developed. A liquid crystal (LC) display panel, electroluminescence (EL) display panel and electrochromic (EC) display panel are included among thin display devices.

According to the conventional thin display device, image information is stored in a transistor matrix array provided on a substrate, for every dot. The image information thus stored is displayed in accordance with the above-mentioned matrix dots in the liquid crystal layer, EL layer, or EC layer which is disposed on the matrix array.

The display region of the display device which includes the transistor matrix array therein is divided into a matrix of, e.g., m×n (where, m and n are positive integers); and, accordingly, it has (n×m) unit picture elements. A picture element circuit having a memory function is so provided as to correspond to each unit picture element section. Fundamentally, each picture element circuit has a thin-film transistor (TFT) which serves as a transfer gate, and a capacitor for storing a picture element image signal. When the voltage corresponding to the image signal is applied to this capacitor, the capacitor holds this voltage and then applies it to the display layer at a proper time, thereby driving the picture elements to be displayed. One important factor in obtaining a good image display pertains to the fact that the voltage to be applied to the capacitor is efficiently supplied to the display layer, upon its display. However, according to a conventional thin display device such as an LC display panel, the transistor included in the picture element circuit has an undesirable parasitic capacitance between the gate-drain electrodes. Thus, since the above-mentioned signal voltage, which is stored in the capacitor, might be reduced by this parasitic capacitance component, the voltage value to be actually supplied to the display layer could be smaller than the normal value of the signal voltage which was previously applied. The reduction of the signal voltage to be supplied to the display layer interferes with the good image display characteristics of the display layer. Particularly in the case where the transistor is made from a thin-film semiconductor material such as amorphous silicon, the width of the transistor's channel region must be enlarged to sufficiently reduce the ON resistance of the channel, since the above-mentioned material has small electric field effect mobility. In this case, the parasitic capacitance component, which is included in the picture element circuit, increases with an increase in the channel width of the switching TFT. Consequently, the reduction of the image signal voltage due to the parasitic capacitance is further exaggerated, rendering the operation of the display device by the transistor matrix array difficult. This problem has been as major obstacle to the realization of a thin display device which includes a transistor matrix array employing a TFT made from a semiconductor material with low carrier mobility.

SUMMARY OF THE INVENTION

It is therefore an object of the present invention to provide a thin-film transistor circuit which is preferably utilized in performing the image display driving of a thin display device, such as a liquid crystal display device, and which compensates for the voltage drop of the image signal caused by the parasitic capacitance component which is undesirably included in a display drive circuit of such a kind of display device, thereby promoting good image display.

According to the present invention, to attain the above object, a thin-film transistor circuit for driving a thin display device includes a plurality of circuit components which control the picture element display in unit picture element regions of the thin display device. The circuit components are arranged so as to form a matrix connected to data lines supplying an image signal and connected to address lines substantially crossing the data lines perpendicularly and supplying a first pulse signal to command the transmission of the image signal. Each circuit component has a capacitor section, a transfer gate section and a voltage compensating section. The capacitor section is connected to one unit picture element region of the thin display device to receive the image signal, which is temporarily stored therein. The transfer section performs switching operation in response to the first pulse signal, thereby transferring the image signal to the capacitor section. The transfer section contains a thin-film transistor which has a gate electrode connected to one of the address lines, a source electrode connected to one data line, and a drain electrode connected to the aforementioned capacitor section. The voltage compensating section supplies the capacitor section with a second pulse signal, which signal is synchronized with the first pulse signal and has a polarity opposite to that of the first pulse signal, thereby preventing the image signal voltage across the capacitor section from decreasing.

BRIEF DESCRIPTION OF THE DRAWINGS

The present invention is best understood with reference to the accompanying drawings, in which.

DETAILED DESCRIPTION OF THE PREFERRED EMBODIMENTS

Prior to a description of embodiments of the present invention, a conventional display drive circuit of a liquid crystal (LC) display device will be described with reference to the drawings, to facilitate understanding of the present invention.

Figure 1:
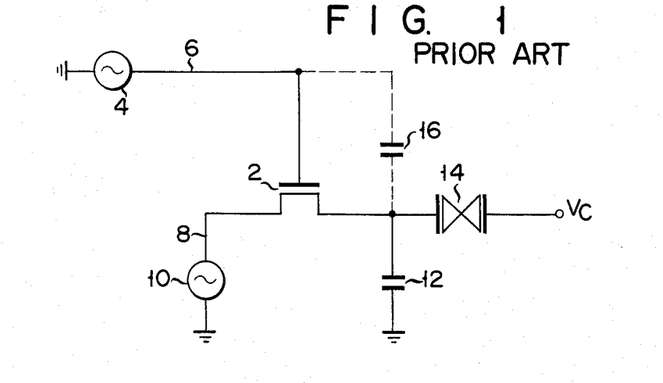
FIG. 1 is a circuit diagram showing the arrangement of one picture element circuit of a conventional thin-film transistor circuit which may be adopted to drive the display by means of a liquid crystal display device.

Conventionally, a picture element circuit (i.e., a circuit used to drive an LC layer corresponding to one picture element of the LC display) of a display drive circuit to a provided in an LC display device has a fundamentally simple configuration, such as that illustrated in FIG. 1. The reason for its simple arrangement is that it is necessary to increase the number of picture elements in one display screen, to obtain a display image with a high degree of accuracy and fineness on the LC display. A simple circuit is more advantageous, since the transistor circuit is formed with high manufacturing yield in a picture element region thus narrowed on the display substrate.

In the conventional picture element circuit shown in FIG. 1, a switching transistor 2 is ON/OFF controlled in response to a voltage pulse signal to be supplied from a first power supply 4, through an address line 6, to its own gate. A picture element signal is supplied from a second power supply 10 to the source of the MOS transistor 2 through a data line 8. The drain of the transistor 2 is grounded through a capacitor 12 for storing the signal voltage and is connected to an LC layer section 14. When a high gate pulse signal for making the transistor 2 conductive is input to the address line 6, the transistor 2 is turned ON. At this time, an image signal to be transmitted through the data line 8 is supplied to the capacitor 12 through the conductive transistor 2 and is stored therein. While the gate potential of the transistor 2 is at zero volts, the capacitor 12 holds the voltage value corresponding to the image signal. When the image voltage signal thus stored in that capacitor 12 is supplied to the LC layer 14 in response to the turning-off of the transistor 2, the image corresponding to one picture element is displayed in the LC layer 14.

However, since a parasitic capacitance actually exists between the gate-drain of the MOS transistor 2, this means that the additional capacitor indicated by reference numeral 16 in FIG. 1 is connected to the above-mentioned signal storing capacitor 12 (this connecting relationship being represented by the dotted line of FIG. 1). As a result of this, at that moment when the channel region of the transistor 2 is closed in response to the reception of the gate signal whose level is zero or not greater than that of the threshold voltage, the image signal voltage which has been stored in the capacitor 12 is decreased due to the parasitic capacitance. Thus, portion $\Delta V$ of the original (or initial) image signal voltage, which was input through the transistor 2, could have been trapped in the parasitic capacitor 16 and, accordingly, the voltage which is only the voltage component $\Delta V$ lower than the original image signal voltage is merely used to drive the LC layer 14. This would cause the image display efficiency in the LC layer 14 to become worse. In addition, the operating point in the liquid crystal driving changes and black-and-white indications are inverted, so that the image display will now be normally performed.

A polycrystal material such as Si, CdSe, Te, CdS, etc., in the crystalline, polycrystalline, or amorphous state, etc., may be used as the semiconductor material of the transistor. To realize the above-mentioned matrix array of a large area with a low production cost, polycrystalline semiconductor materials and amorphous Si or the like, which may be manufactured by a low-temperature process, have recently received a great deal of attention. With a thin-film transistor using such thin-film semiconductor materials, since the electric field effect mobility is markedly lower than that of a MOS transistor made of crystalline Si, or the like, it is necessary to make the channel width of the transistor fairly large and to set the ON resistance of the channel low enough to sufficiently store the image signal in the capacitive load 12, within a time period $\Delta t$ equivalent to a pulse width of the gate pulse signal. In such a large thin-film transistor, the reduction amount $\Delta V$ of the stored voltage could have been substantially enlarged, since the parasitic capacitance 16 is significantly enlarged. Such reduction of the image signal voltage makes operation of the display device by means of the transistor matrix array difficult and, in particular, is a great obstacle in the realization of a thin-film transistor matrix array consisting of a semiconductor material with low mobility.

Figure 2:
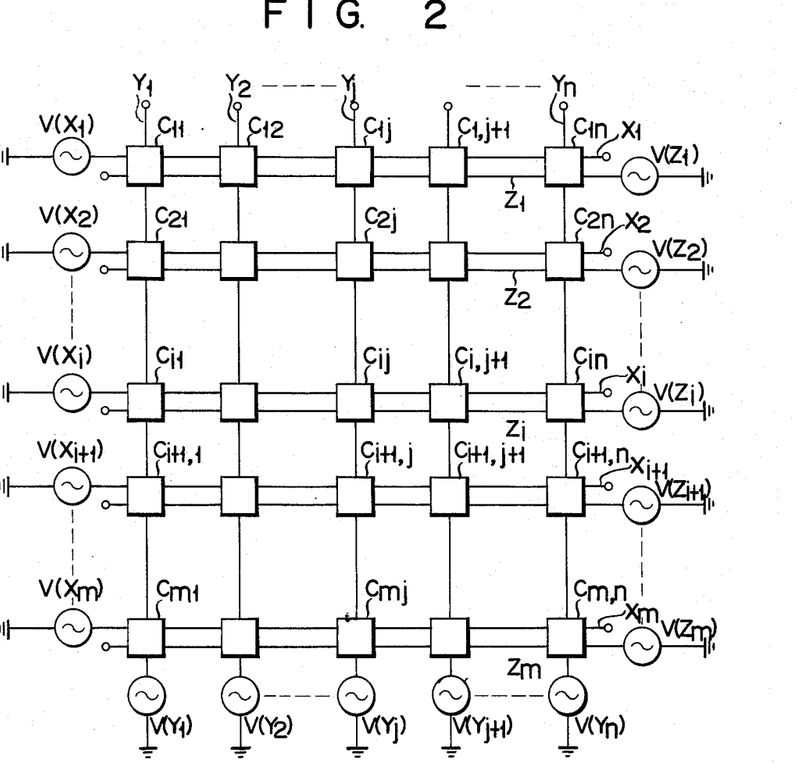
FIG. 2 is a diagram showing the overall arrangement of a thin-film transistor circuit (including a picture element circuit section which is arranged in the form of a matrix) used to drive the liquid crystal display device of one embodiment according to the present invention.

FIG. 2 shows a thin-film transistor circuit which serves to drive the liquid crystal display device in accordance with a first embodiment according to the present invention. This liquid crystal display (LCD) device has unit picture elements which are arranged in the form of an m×n matrix. In the circuit arrangement of FIG. 2, (m×n) picture element circuits $C_{11}$, $C_{12}$, ... $C_{1n}$, ... , $C_{m1}$, ... , $C_{mn}$, each of which drives corresponding unit picture elements of the LCD and has a memory function, are arranged in the form of a matrix, through m address lines X and n data lines Y. The image information of the LCD picture element is stored in corresponding picture element circuit C. The image display is performed in liquid crystal layer (not shown) of FIG. 2, which is provided on the transistor matrix array, in accordance with these image information. The address lines $X_1$, $X_2$, ... , $X_m$ are connected to DC power supplies $V(X_1)$, ... , $V(X_m)$, respectively while data lines $Y_1$, ... , $Y_m$ are connected to DC power supplies $V(Y_1)$, ... , $V(Y_m)$, respectively.

Figure 3:
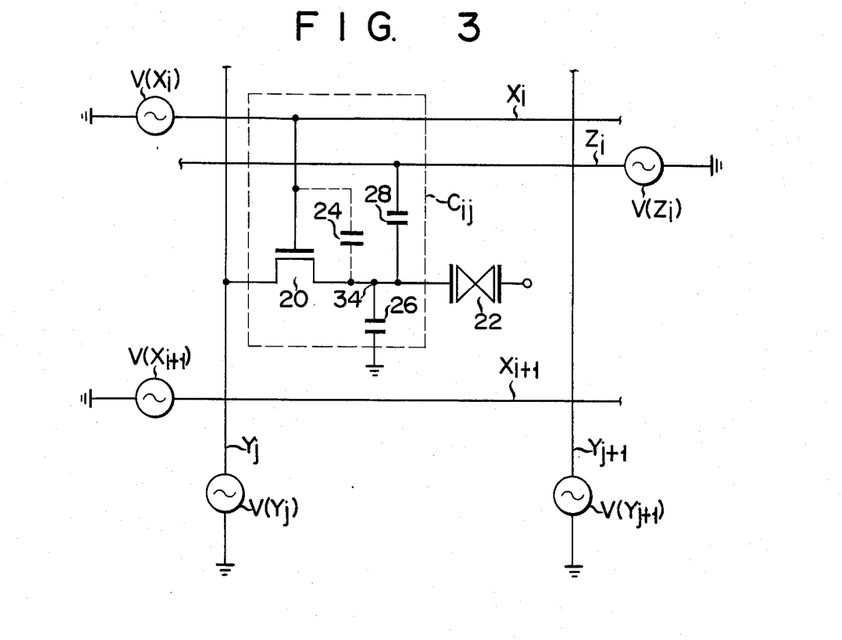
FIG. 3 is a circuit diagram showing the internal arrangement of one picture element circuit which exists in the (i,j)th matrix position among the various picture element circuits shown in FIG. 2.

With reference to FIG. 3, the internal arrangement of one picture element circuit $C_{ij}$ among the picture element circuits C is illustrated here in detail. The internal arrangements of the other picture element circuits are similar to that of this picture element circuit $C_{ij}$. The picture element circuit $C_{ij}$ includes a thin-film transistor (TFT) 20 which serves a transfer gate for an image signal to be displayed in a unit LCD layer 22. The TFT 20 has its gate electrode connected to the i-th address line $X_i$, and the source electrode thereof is connected to the j-th data line $Y_j$. The drain electrode of the TFT 20 is connected to the unit LCD layer 22. Reference numeral 24 designates a capacitor which equivalently represents the parasitic capacitance component to be caused between the gate and drain of the TFT 20. A signal storage capacitor 26 is provided between the TFT drain electrode and the ground. This embodiment also has m third lines $Z_1, \ldots, Z_m$, which are parallel to the address lines X and connect each picture element circuit column. These lines $Z_1, \ldots, Z_m$ are each connected to their respective power supplies $V(Z_1), \ldots, V(Z_m)$ for voltage compensation. In the picture element circuit $C_{ij}$ of FIG. 3, a capacitor 28 is provided between the i-th compensation line $Z_i$ and the drain of the TFT 20. Therefore, according to the circuit of this embodiment, a compensating voltage $V_z$ is supplied, through the capacitor 28, to the capacitor 26 for storing the image signal.

Figure 4A:
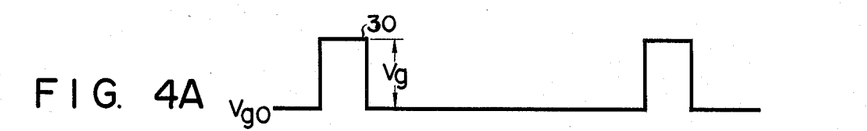
FIGS. 4A to 4D are diagram showing the waveforms of the signals to be supplied to the principal sections of the picture element circuit of FIG. 3.
Figure 4B:
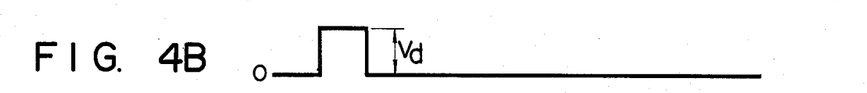
Figure 4C:
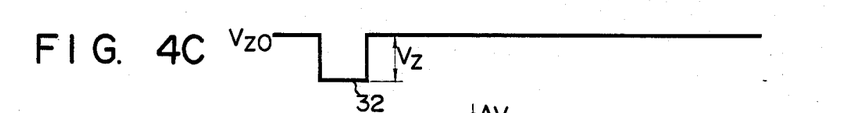
Figure 4D:
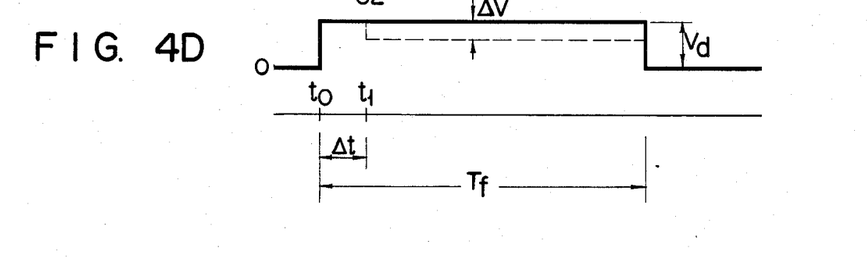

When the gate pulse signal having the waveform shown in FIG. 4A (for turning on the TFT 20) is supplied through the address line $X_i$ to the gate of TFT 20, this TFT 20 is rendered conductive in response to this signal. Thus, the image signal (FIG. 4B) provided on the data line $Y_j$ is stored in the capacitor 26, through this conductive TFT 20. At this time, the compensating signal, which is synchronized with the gate pulse signal of FIG. 4A and has a pulse component 32 of a polarity opposite to that of the pulse component 30 of the gate pulse signal shown in FIG. 4C, is supplied to the signal storage capacitor through the additional capacitor 28. Therefore, it is prevented that a signal component (indicated as "$\Delta V$" in FIG. 4D) of the image signal stored in the capacitor 26 decreases due to the voltage drop at the parasitic capacitor 24 to be caused between the gate and drain of the TFT 20. The amount of charge $Q_-$ to be accumulated at a common contact 34 of the three capacitor components 24, 26, 28 which are included in the picture element circuit $C_{ij}$ (FIG. 3) at time $t_1$ when only the time period $\Delta t$ has elapsed from time $t_0$ when the TFT 20 had been turned ON (i.e., the point in time immediately before the TFT 20 is turned OFF) is expressed as follows:

$$Q_- = C_s V_d + C_p(V_d - V_g - V_{g0}) + C_z(V_d + V_z - V_{z0}) \quad (1)$$

where
 $C_s$: capacitance of the signal storage capacitor 26,
 $C_p$: capacitance of the parasitic capacitor component 24,
 $C_z$: capacitance of the additional capacitor 28,
 $V_g$: pulse potential level of the gate pulse signal,
 $V_d$: potential level of the image signal,
 $V_z$: compensating voltage.

The charge amount $Q_+$ at the contact 34 immediately after the above-mentioned time $t_1$ (i.e., at the point in time immediately after the TFT 20 was turned OFF) is expressed as follows:

$$Q_+ = C_s(V_d - \Delta V) + C_p(V_d - \Delta V - V_{g0}) + C_z(V_d - \Delta V - V_{z0}) \quad (2)$$

From the above equations (1), (2), the amount of signal voltage drop $\Delta V$ of the image signal may expressed as follows:

$$\Delta V = \frac{C_p \cdot V_g - C_z \cdot V_z}{C_s + C_p + C_z} \quad (3)$$

As may be seen from the above equation (3), it is possible to set $\Delta V$ at zero by supplying to the signal storage capacitor 26 the compensating pulse signal represented by the equation, $V(z) = (C_p/C_z)V_g$, which signal has a voltage, i.e., $-(V_g + V_{g0})$ of a polarity opposite to that of the pulse potential $V(x) = V_g + V_{g0}$ of the gate pulse signal (FIG. 4A) to be supplied to the gate of the TFT 20. It is therefore possible to favorably compensate for the reduction of the signal voltage of the image signal to be displayed in the unit picture element 22, which reduction is due to the negative influence of the parasitic capacitor at the transfer gate 20.

Figure 5:
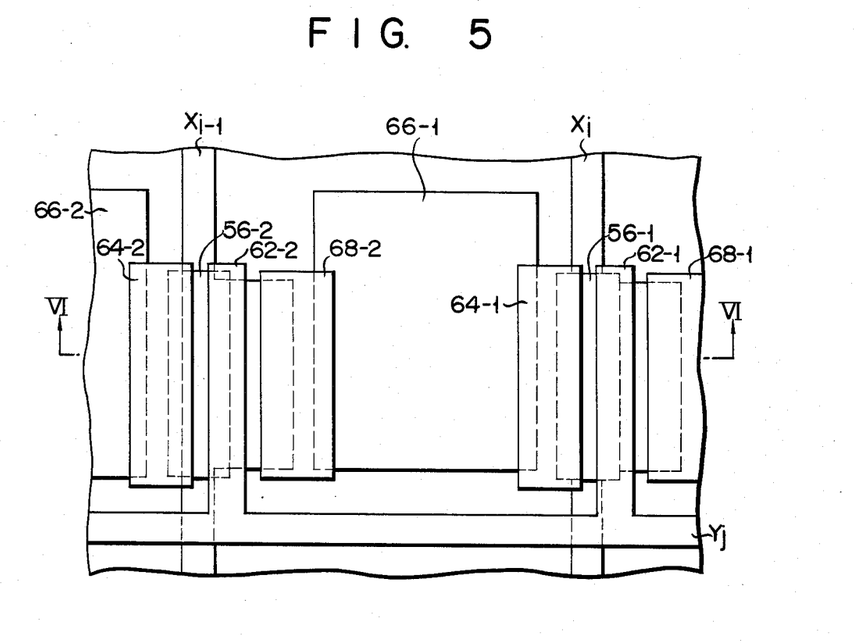
FIG. 5 is a plan view showing the principal section of a liquid crystal display device to which a thin-film transistor circuit of a second embodiment according to the present invention is applied.
Figure 6:
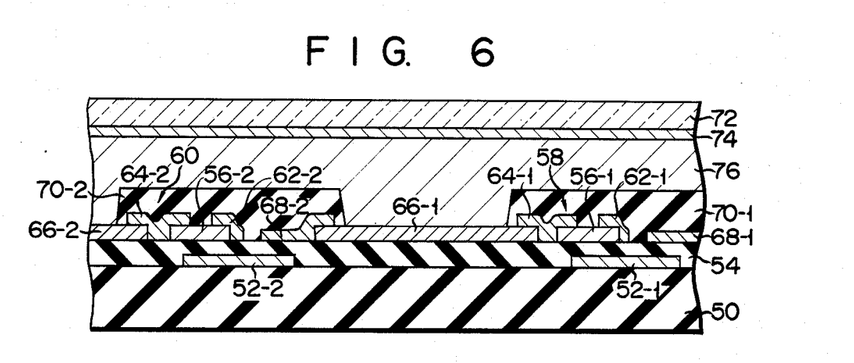
FIG. 6 is a diagram illustrating a cross-sectional arrangement taken along line VI—VI of the liquid crystal display device of FIG. 5.

FIGS. 5 and 6 are, respectively, a plan view and a cross-setional view of a liquid crystal display device which includes therein a thin-film transistor circuit of the second embodiment of the present invention. Gate electrode films 52-1 and 52-2, which are constituted integrally with the address lines $X_{i-1}$ and $X_i$, respectively, are formed on an insulative substrate 50. A silicon dioxide ($SiO_2$) film 54, which serves as a gate insulation layer, is deposited on those gate electrode films 52-1, 52-2. Thin-film transistors 58, 60 made of amorphous silicon films 56-1, 56-2, which had been deposited on the $SiO_2$ film 54 after the patterning was performed, are further provided on the $SiO_2$ film 54. Source electrodes 62-1 and 62-2 are so provided as to come into contact with the amorphous silicon films 56-1 and 56-2 of the TFTs 58 and 60 on the $SiO_2$ film 54, respectively. These electrodes 62-1, 62-2 are patterned and integrally formed with respect to the data line $Y_i$. Drain electrodes 64-1, 64-2 are connected to the transistors 58, 60 and display electrode layers 66-1, 66-2. Reference numerals 68-1 and 68-2 respectively indicate each one terminal electrode of an additional capacitance (or compensating capacitor) 80 (FIG. 7) which is so formed as to partially face the gate electrodes 52-1, 52-2 through the $SiO_2$ film 54. (This additional capacitor corresponds to the capacitor 28 in the picture element circuit $C_{ij}$ shown in FIG. 3.) These transistor matrix arrays, excluding the display electrodes 66, are covered by $SiO_2$ films 70-1 and 70-2. A glass substrate 72 on which a transparent conductive film 74 is formed is superimposed over the transistor matrix array structure constituted in the manner described above. A liquid crystal material is used to seal the sealing space between the transistor array structure and the glass substrate 72, thereby constituting a liquid crystal layer 76.

Figure 7:
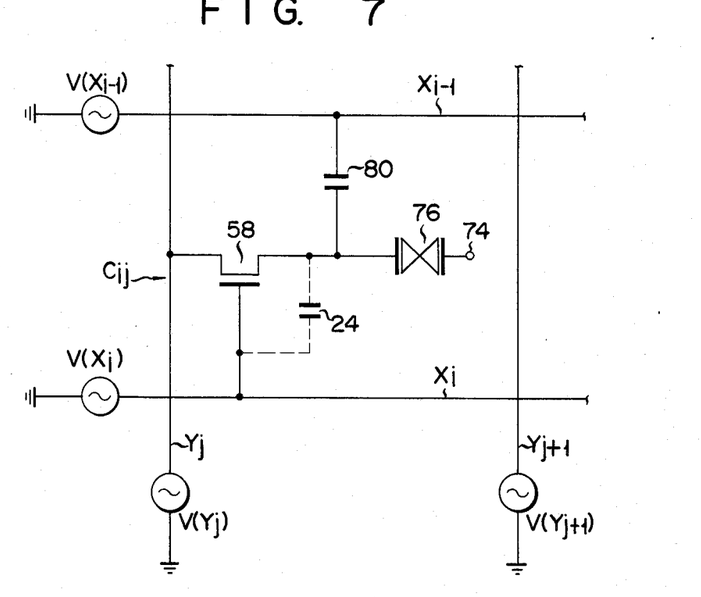
FIG. 7 is a circuit diagram showing the internal arrangement of one (i,j)th picture element circuit which is included in the thin-film transistor circuit formed in the LCD device shown in FIGS. 5 and 6.
Figure 8A:
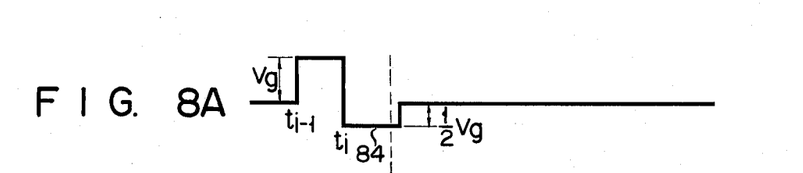
FIGS. 8A to 8D are diagrams showing the waveforms of the signals to be generated in the principal sections of the picture element circuit of FIG. 7.
Figure 8B:
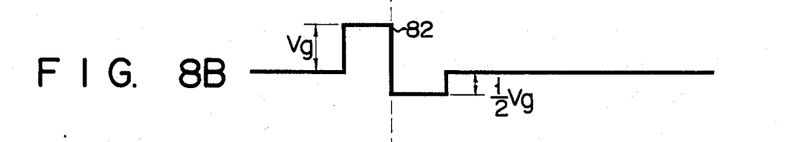
Figure 8C:
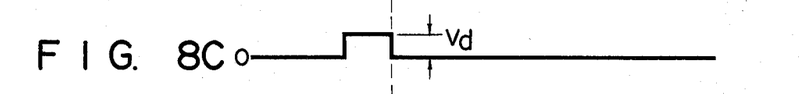
Figure 8D:
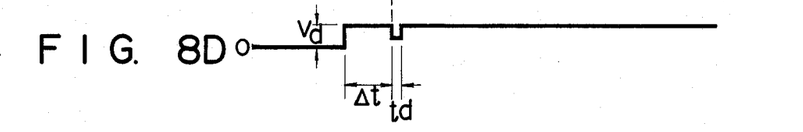

An equivalent circuit of the principal section of the thin-film transistor array for driving the liquid crystal display device of FIGS. 5 and 6 is shown in FIG. 7. In the circuit of FIG. 7, since the same elements and components as those shown in FIG. 3 are designated by the same reference numerals, their descriptions are omitted here. In FIG. 7, one end of the additional capacitor, i.e., the compensating capacitor 80 connected to the TFT 58, which is included in the picture element circuit $C_{ij}$ connected to the address line $X_i$ and which serves as the transfer gate, is connected to the adjacent address line $X_{i-1}$ which is one line before the address line $X_i$. In this second embodiment, the third line for supplying the compensating voltage $V_z$ to the picture element circuit $C_{ij}$, i.e., the address line for supplying the compensating pulse (corresponding to $Z_i$ of FIG. 3) is not provided.

This is because, according to this second embodiment, the address line $X_i$ for supplying the gate pulse signal also serves as the address line ($Z_i$) for supplying the compensating pulse (mentioned above). Furthermore, in FIG. 7, the capacitor for storing the image signal is not specially provided; though the synthetic capacitance obtained by synthesizing in parallel the capacitance of the liquid crystal layer 76 itself, the additional capacitance 80, and the parasitic capacitance 24 of the TFT 58 is used as the capacitor for storing the image signal voltage. It should also be noted that the capacitance of the additional capacitor 80 is preferably set to be about twice the capacitance value of the parasitic capacitor 24 when the TFT 58 is conductive. In addition, the above-mentioned picture element circuits are aligned to define rows and colums of a 50×50 (where, m=n=50) matrix.

The operation mode of the liquid crystal display device of the second embodiment, which is constituted as described above, may be described as follows, with reference to FIGS. 8A to 8D, as well as FIGS. 5 to 7. The pulsating image voltage signal $V_d$ (FIG. 8C) to be supplied through the data line $Y_i$, during the period between time $t_i$ and time $t_i + \Delta t$, is stored in the drain electrode terminal of the transfer gate TFT 58. This image voltge signal $V_d$ is continuously held until another image signal is nextly supplied after time $t_i + \Delta t$. At this time, during the period from time $t_i$ to the time when $\Delta t + t_d$ (where, $t_d > 0$) has elapsed, in order to prevent the voltage drop of the image signal $V_d$ which is due to the influence of parasitic capacitor 24, a positive gate pulse 82 of voltage level $V_g$ (FIG. 8B) is applied to the address line $X_i$ and, at the same time, the compensating pulse 84 (FIG. 8A) having a voltage depth of $V_g/2$ and a polarity opposite to that of this gate pulse 82 (i.e., negative polarity) is applied to the address line $X_{i-1}$. Thus, it is possible to diminish the signal voltage drop $\Delta V$ represented by the previously mentioned equation (3) to substantially zero. It should be noted that the pulse width of the compensating pulse 84 mentioned above may not necessarily be identical to that of the gate pulse 82 to be applied to the address line $X_i$. It might also be possible to start applying the compensating pulse from any time unit time $t_i + \Delta t$, after applying the gate pulse 82 to the address line $X_i$.

According to the second embodiment described above, the address line $Z_i$ for supplying the compensating pulse need not be specially provided, since the ordinary address line $X_i$ also simultaneously and commonly serves as the line for applying the compensating pulse signal to the TFT drain. This simplifies the transistor gate array structure and also permits an effect similar to that of the first embodiment.

Figure 9:
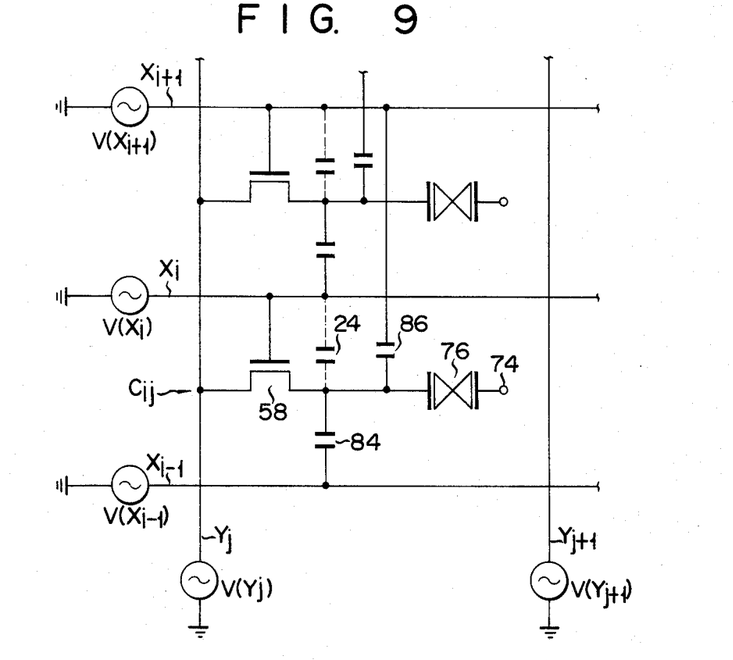
FIG. 9 is a circuit diagram showing the internal arrangement of one picture element circuit provided in the (i,j)th matrix position in a thin-film transistor circuit of a third embodiment according to the present invention.

FIG. 9 illustrates the circuit arrangement of a principal section of a third embodiment of the present invention. Since the same elements and components as those of the second embodiment (FIG. 7) are designated by the same reference numerals, their descriptions are omitted here. In FIG. 9, the capacitor 84 used only for the storage of the image signal voltage is provided between the (i−1)th address line $X_{i-1}$ and the drain electrode of the transfer gate TFT 58. On the other hand, an additional capacitor 86 is connected between the TFT drain and the address line $X_{i+1}$ adjacent to the address line $X_i$ on the opposite side of address line $X_{i-1}$. This additional capacitor 86 is so selected that its capacitance is equal to the capacitance value of the parasitic capacitor 24 when the TFT 58 is in the conductive state.

Figure 10A:
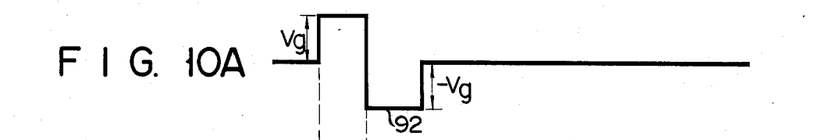
FIGS. 10A to 10E are diagrams showing the waveforms of the signals to be generated or supplied in the principal sections of the picture element circuit of FIG. 9.
Figure 10B:
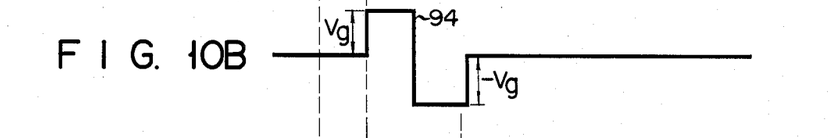
Figure 10C:
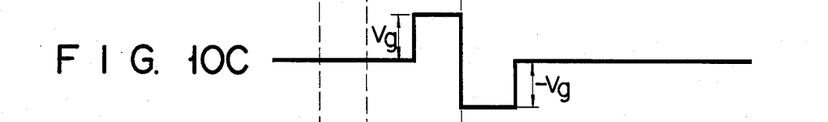
Figure 10D:
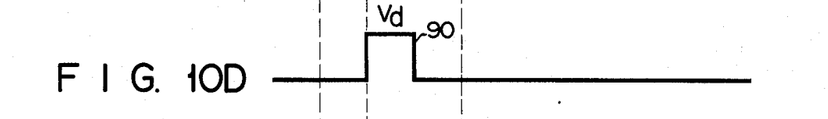
Figure 10E:
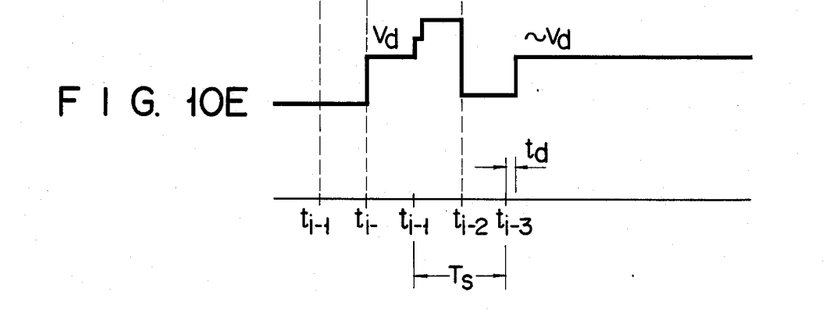

FIGS. 10A to 10C illustrate the signal waveforms of the gate pulse signals to be supplied to the address lines $X_{i-1}$, $X_i$ and $X_{i+1}$, respectively. FIG. 10D represents the waveform of the image signal having pulse voltage level $X_d$, which signal is to be applied to the data line $Y_j$. FIG. 10E represents the waveform of signal voltage $\phi_{ij}$ to be applied to the liquid crystal layer 72 of the LCD device. A pulse 90 (FIG. 10D) of the image signal $V_d$ to be supplied through the data line $Y_i$ to the picture element circuit $c_{ij}$ during the period of time denoted as $t_i - t_{i+1}$ is stored in the capacitor 84. At this time, as shown in FIG. 10A, a compensating pulse 92 having a polarity opposite to but with the same peak value (i.e., $-V_g$) as a gate pulse 94 on address line $X_i$ having peak value $V_g$ is supplied to the address line $X_{i-1}$. This compensating pulse 92 is also intermittently applied for only the time period $t_d$, even after time $t_{i+1}$. (However, even if $t_d$ is zero, this will not actually be an essential problem with respect to the operation of the LCD device.) In this situation, although the image signal voltage $\phi_{ij}$ to be applied to the liquid crystal layer 76 of the unit picture element has values other than the voltage $V_d$ of the above-mentioned image signal pulse 90 from the data line $Y_i$ during the period denotes $T_s = t_{i+1} \sim t_{i+3}$, as shown in FIG. 10E, this voltage is equal to the above-mentioned voltage value $V_d$ after only time period $t_d$ has elapsed, from time $t_{i+3}$, whereby the fundamental operation of the picture element display is performed. The fact that the period $T_s$ during which the image signal is to be applied to the liquid crystal layer 76 temporarily fluctuates presents no particular problem, since it is substantially shorter than the time period during which the LCD device holds the picture element display.

According to the third embodiment thus constructed, when the gate pulse 94 which affects the transmission of the image signal to the address line $X_i$ to be connected to the picture element circuit $C_{ij}$ by turning on the TFT 58 is applied, the address line $X_{i-1}$ which is one line before the address line $X_i$ and to which the additional capacitor 84 is connected serves as the compensating pulse supplying line for the picture element circuit $C_{ij}$. At this time, the adjacent address line $X_{i+1}$ on the opposite side of the address line $X_i$ functions as the grounded line for the picture element circuit $C_{ij}$. By applying the compensating pulse signal to one end of the liquid crystal layer 76 to be connected to the drain pattern line of the TFT 58 through the additional capacitor 84, it is possible to almost completely compensate for the voltage drop of the image signal to be stored in this capacitor 84 due to the parasitic capacitor 24. In this embodiment, there is no particular need to provide a ground potential (zero potential) in the picture element region. This enables the transistor matrix array structure to be further simplified and, accordingly, it is possible to realize a high manufacturing yield with respect to the LCD device; and, an image display with a high degree of accuracy and fineness via the LCD device may be obtained at the same time. Thus, it is possible to realize a TFT matrix array which is capable of driving the LCD with a high degree of reliability.

Although the present invention has been shown and described with respect to particular embodiments, various changes and modifications, which are obvious to a person skilled in the art to which the invention pertains, are deemed to lie within the spirit and scope of the invention.

The above description was made with respect to the TFT circuit which is used to drive the LCD device.

Figure 11:
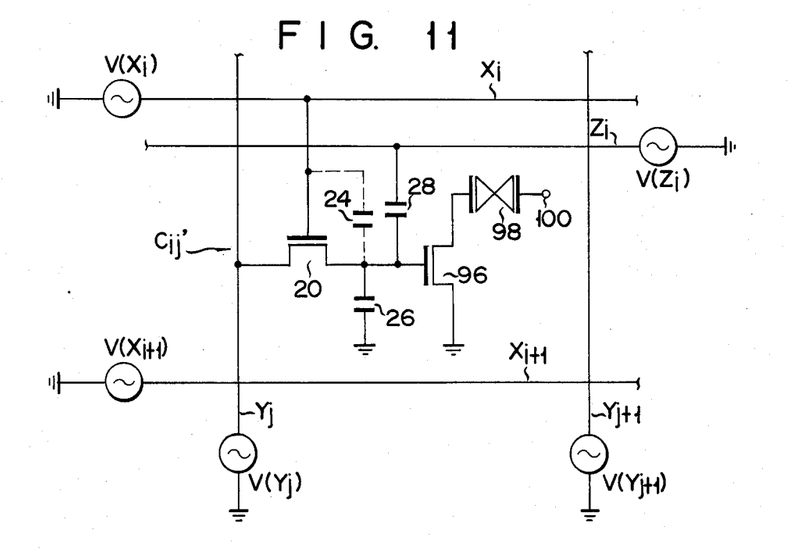
FIG. 11 is a circuit diagram showing the internal arrangement of one picture element circuit which is included in the thin-film transistor circuit applied to an EL display device.

However, the constitutional concept of the TFT circuit of the present invention can also be applied to other thin display devices. In FIG. 11, a TFT circuit illustrated is one to which the fundamental concept of the first embodiment of FIG. 3 has been applied, and one which is designed for use with an EL display device. The picture element circuit $C_{ij}$, designed for use with the EL display device has two TFTs 20, 96. The image signal is stored in the capacitor 26 which serves to store the image signal, by performing the switching operation of the TFT 20 in a manner similar to the case of the first embodiment described with reference to FIG. 3. Image signal $\phi_{ij}$ is supplied to the gate of the second TFT 96. This switching operation of the TFT 96 is controlled by that image signal $\phi_{ij}$. This enables the display of an EL layer 98 for receiving an AC voltage from a terminal 100 to be driven.

With the thin-film transistor of the present invention, since the mobility of the semiconductor material is small, the channel width has to be set at a larger value to a certain extent, for the purpose of high-speed operation. Therefore, since any such transistors may be used, the influence due to the parasitic capacitance between the gate and drain is not negligible. To apply a gate pulse and compensating pulse having a polarity opposite to that of the signal voltage to the drain end, transistors having a so-called MOS transistor construction, which generally has a pn junction at its source-drain, are excluded. This is because, when the compensating pulse is applied, the pn junction present serves as the forward bias, so that its effect cannot be obtained. However, the MOS transistor structure will not cause a problem if the device region is electrically isolated from other regions and is in a total floating state.

Furthermore, the semiconductor material of the transistor is not limited to amorphous Si, since polycrystalline or crystalline silicon might also be used, as may a semiconductor material such as CdSe, CdS, etc. The additional capacitance may be set to an arbitrary value, and the proper setting of the magnitude of the compensating pulse to be applied to the additional capacitor allows the effect of the present invention to be fully attained. It is not always necessary to use the (i-1)th address line, as in the case of the present embodiment, to send the compensating pulse to be applied to the additional capacitor in the (i, j)th picture element circuit, and any address lines other than the i-th address line may be used. As shown in FIG. 9, where one end of the (i,j)th capacitor 86 is grounded by an address line, the address line used here need not limited to the (i+1)th address line; since any address lines, other than the address line used to send the gate and compensating pulses, may be employed for this purpose.

What is claimed is:

1. A thin-film transistor circuit for driving a display device, said circuit comprising:
    a plurality of circuit components which control picture element display in unit picture element regions of said display device and which are arranged so as to form a matrix connected to data lines supplying an image signal and connected to address lines substantially crossing the data lines perpendicularly and supplying a first pulse signal to command the transmission of the image signal, each of said circuit components comprising,
    (a) first capacitor means, provided in a unit picture element region of said display device, for receiving and temporarily storing the image signal,
    (b) transfer gate means for performing a switching operation in response to the first pulse signal, thereby transferring the image signal to said first capacitor means, said transfer gate means including a thin-film transistor having a gate electrode connected to one of the address lines, a source electrode connected to said first capacitor means, and
    (c) voltage compensating means connected to said first capacitor means, for preventing the image signal voltage across the first capacitor means from decreasing, said voltage compensating means including
    signal generator means for generating a second pulse signal which is synchronized with the first pulse signal and has a polarity opposite to that of the first pulse signal,
    second capacitor means provided between said signal generating means and a common contact of said first capacitor means and said transistor drain electrode, and
    signal transmitting means for transmitting the second pulse signal to said second capacitor means, whereby the second pulse signal is supplied to said first capacitor means through said second capacitor means.

2. The circuit according to claim 1, wherein said voltage compensating means applies to said second capacitor means the second pulse signal having a voltage value high enough to compensate for a reduction of signal voltage resulting from a partial leakage of the image signal voltage stored in said first capacitor means into a parasitic capacitance component existing between the gate and drain electrodes of said thin-film transistor.

3. The circuit according to claim 2, wherein said signal transmitting means includes:
    a signal transmission line which is connected to said signal generator means and is substantially parallel to said one address line.

4. The circuit according to claim 3, wherein said voltage compensating means generates the second pulse signal so as to have a voltage value substantially equal to:

$$-\frac{C_p}{C_z} \cdot V_g$$

where
$C_p$: the parasitic capacitance existing in said transistor,
$C_z$: capacitance of said second capacitor means,
$V_g$: pulse voltage of the first pulse signal.

5. The circuit according to claim 3, wherein said display device includes a liquid crystal display device.

6. A liquid crystal display device comprising:
    a substrate having display electrodes to define a plurality of unit picture element regions of said liquid crystal display device;
    a transparent electrode plate which is located spatially apart from said substrate and forms a sealed space therebetween;
    a liquid crystal layer sealed between said substrate and said transparent electrode plate;
    display drive circuit means integrated and formed on said substrate, for controlling the picture element display of said liquid crystal layer, said display drive circuit means comprising a plurality of picture element circuit units which are arranged in an m×n matrix form (where m, n: positive integer) corresponding to said unit picture element regions, each of which circuit units includes first capacitor means, connected to said unit picture element region, for receiving and temporarily storing an image signal, and transfer gate means containing a thin-film transistor, for receiving a gate pulse signal and for performing a switching operation in response to said pulse signal so as to transfer said image signal to said first capacitor means; and voltage compensating means connected to said first capacitor means, for preventing the image signal voltage across the first capacitor means form decreasing, said voltage compensating means including, signal generator means for generating a second pulse signal which is synchronized with the first pulse signal and has a polarity opposite to that of the first pulse signal, second capacitor means provided in each of said picture element circuit units and connected to the drain electrode of said thin-film transistor, and signal transmitting means for transmitting the second pulse signal to said second capacitor means, whereby the second pulse signal is supplied to said first capacitor means through said second capacitor means.

7. The device according to claim 6, wherein said display drive means further comprises:

m address lines, commonly and respectively connected to said m-row picture element circuit units, for transmitting said gate pulse signal; and n data lines, commonly and respectively connected to said n-column picutre element circuit unit, for transmitting said image signal.

8. The device according to claim 7, wherein said thin-film transistor has, in one picture element circuit unit defining an (i,j)th matrix position, a gate electrode connected to an i-th (where $0<i<m$, n) address line, a source electrode connected to a j-th (where, $0<j<m,n$) data line, and a drain electrode connected to said first capacitor means.

9. The device according to claim 8, wherein said first capacitor means is substantially constituted by said unit picture element region and a parasitic capacitance component existing in said thin-film transistor; and wherein said second capacitor means provided in the (1, j)th (where $0<i<m$, $0<j<n$) picture element circuit unit connected to the i-th address line and the j-th data line among said plurality of picture elemnt circuit units is connected between the drain electrode of the thin-film trnsistor of said (i,j)th picture element circuit unit and the (i-1)th address line which is one line before the i-th address line, said compensating pulse signal being supplied thereto through the (i-1)th address line.

10. The device according to claim 8, wherein, in said one picture element circuit unit connected to the i-th address line and the j-th data line in the (i,j)th matrix position, said first capacitor means is connected between the drain electrode of said thin-film transistor and another address line which serves as a ground line for said first capacitor means; and wherein said second capacitor means is provided between the drain electrode of said thin-film transistor and still another address line which also serves as the signal transmitting means for said second pulse signal.

* * * * *